(12) United States Patent
Shim

(10) Patent No.: US 7,921,895 B2
(45) Date of Patent: Apr. 12, 2011

(54) ADHESIVE CHUCK, AND APPARATUS AND METHOD FOR ASSEMBLING SUBSTRATES USING THE SAME

(75) Inventor: Seok-Hee Shim, Sungnam (KR)

(73) Assignee: Advanced Display Process Engineering Co., Ltd, Kyunggi-Do (KR)

(*) Notice: Subject to any disclaimer, the term of this patent is extended or adjusted under 35 U.S.C. 154(b) by 680 days.

(21) Appl. No.: 11/802,915

(22) Filed: May 25, 2007

(65) Prior Publication Data

US 2007/0285870 A1   Dec. 13, 2007

(30) Foreign Application Priority Data

May 26, 2006 (KR) .................. 10-2006-0047658
May 26, 2006 (KR) .................. 10-2006-0047670
May 26, 2006 (KR) .................. 10-2006-0047673

(51) Int. Cl.
*B29C 65/18* (2006.01)
*B32B 37/14* (2006.01)
*B23K 37/04* (2006.01)
*H05K 3/36* (2006.01)

(52) U.S. Cl. .................. 156/499; 156/580; 156/583.1; 156/247; 29/830; 29/760; 29/834; 29/900

(58) Field of Classification Search .................. 156/64, 156/73.5, 499, 580, 583.1, 358, 359, 60, 156/247, 290, 292, 297, 455; 29/760, 830, 29/834, 900

See application file for complete search history.

(56) References Cited

U.S. PATENT DOCUMENTS

| | | | | |
|---|---|---|---|---|
| 4,770,600 A | * | 9/1988 | Ishikawa | 414/783 |
| 5,980,663 A | * | 11/1999 | Badehi | 156/64 |
| 6,722,026 B1 | * | 4/2004 | Lent | 29/830 |
| 7,239,589 B2 | * | 7/2007 | Feehan et al. | 369/53.22 |

FOREIGN PATENT DOCUMENTS

| | | | |
|---|---|---|---|
| JP | 11104773 A | * | 4/1999 |
| JP | 2002124559 A | * | 4/2002 |
| WO | WO 2004/097509 A1 | | 11/2004 |

OTHER PUBLICATIONS

English Abstract of JP 2002-124559A.*
Machine English Translation of JP 2002-124559A.*
Machine English Translation of JP 11-104773.*
English Abstract of JP 11-104773.*

* cited by examiner

*Primary Examiner* — Phillip C Tucker
*Assistant Examiner* — Sing P Chan
(74) *Attorney, Agent, or Firm* — Ked & Associates, LLP

(57) ABSTRACT

An adhesive chuck, and an apparatus and method for assembling substrates using the same are disclosed. The apparatus comprises a chamber, a first adhesive chuck inside the chamber and having a plurality of adhesive protrusions to adhere to a first substrate conveyed from an outside into the chamber via an intermolecular attractive force, and a driving unit to move the first substrate adhered to the first adhesive chuck and a second substrate toward each other to be compressed and assembled to each other. The apparatus can achieve adhesion and separation of a substrate with minimal power consumption, enhancing an operating efficiency. Additionally, the adhesive chuck can overcome a problem of spot generation on a display panel caused by remaining static electricity. Furthermore, since the adhesive chuck is almost free from a problem of electric instability, it can exhibit high stability and efficiency and can be fabricated at lower costs.

19 Claims, 10 Drawing Sheets

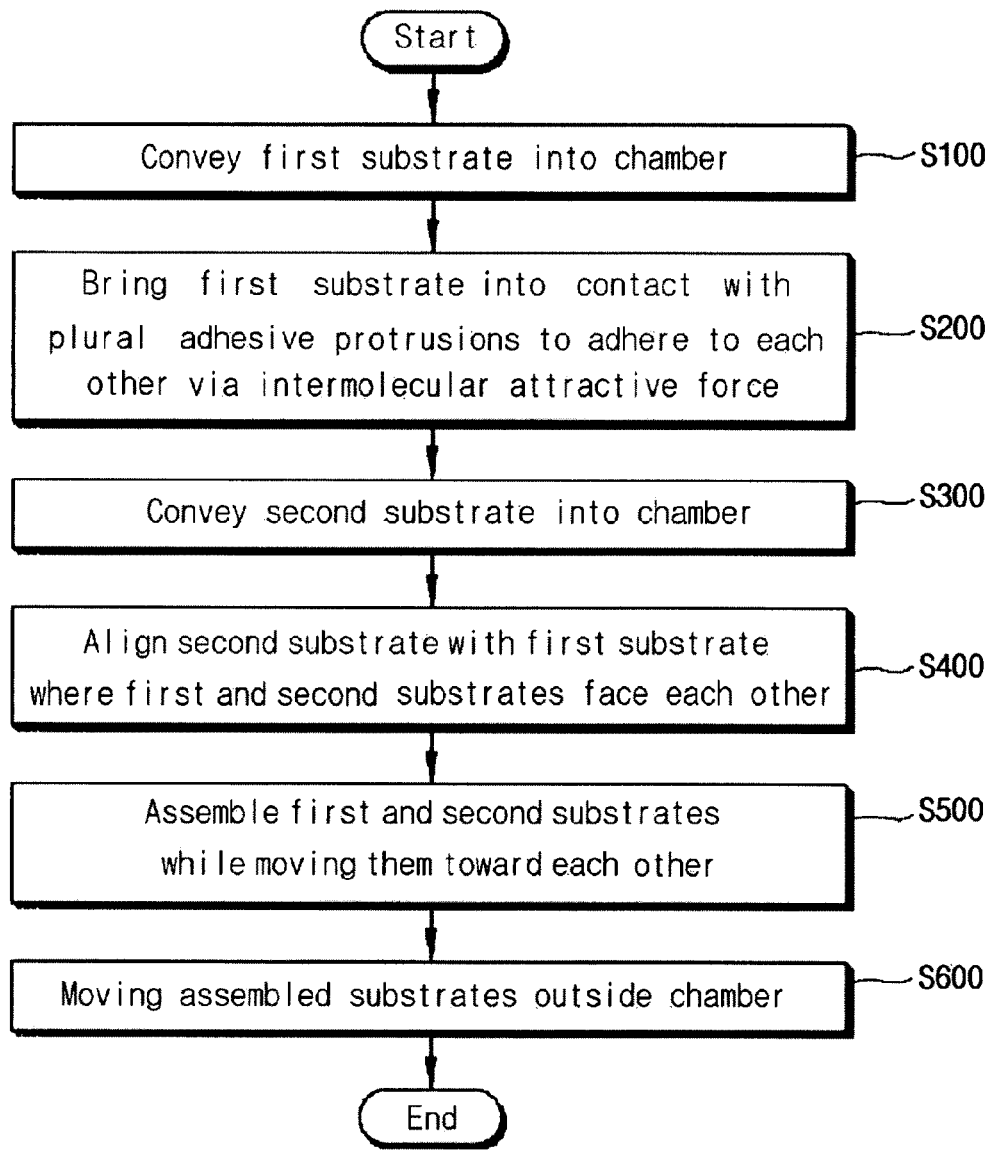

ADHESIVE CHUCK, AND APPARATUS AND METHOD FOR ASSEMBLING SUBSTRATES USING THE SAME

BACKGROUND OF THE INVENTION

1. Field of the Invention

The present invention relates to an adhesive chuck, and an apparatus and method for assembling substrates using the same, and more particularly to an apparatus and method for assembling substrates using an adhesive chuck that adheres to a substrate via an intermolecular attractive force.

2. Description of the Related Art

A substrate assembling apparatus is used for assembling liquid crystal display panels of liquid crystal displays (LCDs). One example of the LCD panels is a TFT-LCD panel. The TFT-LCD panel includes an array substrate having a plurality of thin film transistors (TFT) arranged in a matrix fashion, a color filter substrate having a color filter, a light shielding film, etc. and assembled to the array substrate while facing the array substrate with a gap of several micrometers formed therebetween, and liquid crystals injected into the gap before, during or after assembling the substrates and sealed to fabricate the panel.

Assembly of the substrates can be achieved by compressing the array substrate and the color filter substrate to each other. For this purpose, the apparatus is provided at upper and lower sides with two opposite electrostatic chucks to which the substrates are adsorbed, respectively. Then, with parallelism between the chucks maintained precisely, the chucks are moved toward each other, followed by assembling the substrates.

Most of such substrate assembling apparatuses is configured to perform a substrate assembling process in a vacuum atmosphere. At an initial stage of conveying the substrates into the apparatus, however, since the interior of the apparatus is at ambient pressure, a vacuum adsorption unit is used to adsorb the substrates, and when the interior of the apparatus becomes a vacuum state, the electrostatic chucks are used to adsorb the substrates. Examples of such a substrate assembling apparatus are disclosed in PCT WO 2004/097509, entitled "System for producing pasted substrate," of Fujitsu Limited, PCT WO 2003/091970, entitled "Apparatus for assembling flat panel substrates," of Shinetsu Engineering Kabushiki Kaisha, and the like.

Here, the aforementioned electrostatic chuck used for the assembling apparatus is the most typical one used to hold the substrate in a process of manufacturing semiconductors or display panels. One example of such an electrostatic chuck and a prior technique of assembling substrates using this chuck is disclosed in PCT WO 2004/084298, entitled "Substrate supporting mechanism using electrostatic chuck and method of manufacturing the same," of Tokyo Electron Limited.

The electrostatic chuck is generally formed of an alumina sintered material or an alumina sprayed ceramic material, and includes electrode plates connected to a DC power supply to generate an electrostatic force via application of high voltage to the electrode plates from the DC power supply when supporting the substrate.

Such a conventional electrostatic chuck has several problems. Particularly, it suffers from large power consumption related to requirement of constant supply of DC power to the electrostatic chuck to hold the substrate, generation of spots on an LCD panel due to remaining static electricity associated with an electrode pattern in the chuck when the substrate is adsorbed to the chuck by the electrostatic force, and instability caused by accumulation of the electrostatic force.

Further, since the electrostatic chuck has a precise mechanical and electrical arrangement, it requires high manufacturing costs. Moreover, for an electrostatic chuck coated with a polyimide film, there is likelihood of damage to the polyimide film on the surface of the electrostatic chuck by broken particles of the substrate that can be generated during the process.

SUMMARY OF THE INVENTION

The present invention is conceived to solve the problems of the conventional techniques as described above, and an object of the present invention is to provide a substrate assembling apparatus that enables assembly of substrates in a state of stably maintaining alignment between the substrates via Van der Waals force, an intermolecular attractive force, and a method of assembling the substrates using the apparatus.

It is another object of the present invention to provide an adhesive chuck that adheres to a substrate via Van der Waals force, which is an intermolecular attractive force.

In accordance with one aspect of the present invention, the above and other objects can be accomplished by the provision of a substrate assembling apparatus, comprising: a chamber permitting reduction in pressure thereof; a first adhesive chuck located inside the chamber and having a plurality of adhesive protrusions to adhere to a first substrate conveyed from an outside into the chamber via an intermolecular attractive force; and a driving unit to move the first substrate adhered to the first adhesive chuck and a second substrate disposed within the chamber toward each other to be compressed and assembled to each other. The apparatus may further comprise a second adhesive chuck having a plurality of adhesive protrusions to adhere to the second substrate via the intermolecular attractive force.

The adhesive chuck may comprise a support plate; and an adhesive plate coupled at one side to the support plate and formed at the other side with the adhesive protrusions.

The adhesive plate may comprise the first adhesive chuck located at one side within the chamber and the second adhesive chuck located at the other side within the chamber, and the adhesive protrusions may comprise a plurality of first protrusions formed on one side of the first adhesive chuck to adhere to the first substrate via the intermolecular attractive force and a plurality of second protrusions formed on one side of the second adhesive chuck to adhere to the second substrate via the intermolecular attractive force.

The adhesive chuck may comprise a separating member to separate the substrate from the adhesive protrusions.

The separating member may comprise a heating member to heat the adhesive protrusions, and the adhesive chuck may comprise a cooling member to cool the adhesive protrusions.

The separating member may comprise a plurality of separating pins disposed to move through the adhesive chuck, and a separating bar coupled to distal ends of the separating pins to compress the substrate in a separating direction when separating the substrate.

The separating member may comprise a lift plate disposed at one side of the adhesive chuck and movable up or down within the adhesive chuck to allow the adhesive protrusions to be exposed from the one side of the adhesive chuck when the adhesive protrusions are adhered to the substrate and to be inserted into the one side of the adhesive chuck when the adhesive protrusions are separated from the substrate.

The adhesive chuck may comprise a latch jaw formed at either side of the lift plate, a support jaw formed corresponding to the lift plate inside the adhesive chuck to support the latch jaw, and a lift driving member interposed between the latch jaw and the support jaw to drive the lift plate.

The lift driving member may be a cam of which outer periphery can be rotated in a state of adjoining the latch jaw, the substrate assembling apparatus may further comprise an elastic member disposed at an interface between the adhesive chuck and the lift plate, and the lift plate may be moved obliquely up or down.

In accordance with another aspect of the present invention, there is provided a method of assembling substrates, comprising: conveying a first substrate into a chamber; bringing the first substrate into contact with a plurality of adhesive protrusions to adhere the first substrate to the adhesive protrusions via an intermolecular attractive force; conveying a second substrate into the chamber; aligning the first substrate with the second substrate at a location where the substrates face each other; assembling the first substrate and the second substrate while moving the first and second substrate toward each other; and moving the assembled first and second substrates outside the chamber.

The method may further comprise: evacuating the chamber to form a vacuum before the assembling step.

The method may further comprise: adhering the second substrate to other adhesive protrusions via the intermolecular attractive force before the aligning step.

The method may further comprise: separating the first substrate from the adhesive protrusions by heating the adhesive protrusions before the assembling step.

The method may further comprise: cooling the adhesive protrusions when the first substrate is separated from the adhesive protrusions.

The method may further comprise: separating the first substrate from the adhesive protrusions using a separating bar for pushing the first substrate towards the second substrate before the assembling step.

The method may further comprise separating the first substrate from the adhesive protrusions by lifting or lowering the adhesive protrusions opposite to a direction of adhering to the first substrate before the assembling step.

In accordance with yet another aspect of the present invention, there is provided an adhesive chuck, comprising: a support plate; an adhesive plate disposed on one side of the support plate and having a plurality of adhesive protrusions to adhere to a conveyed substrate via an intermolecular attractive force; and a separating member provided to the support plate to separate the substrate from the adhesive protrusions.

The separating member may comprise a heating member to heat the substrate.

The support plate may comprise a cooling member to cool the adhesive protrusions.

The separating member may comprise a plurality of separating pins disposed to move through the support plate, and a separating bar coupled to distal ends of the separating pins to push the substrate in a separating direction when separating the substrate.

The separating member may comprise a lift plate inserted into the support plate with the adhesive protrusions exposed from the support plate to move up or down through the support plate, and a lift driving member to drive the lift plate to allow the adhesive protrusions to be exposed from the support plate when the adhesive protrusions are adhered to the substrate and to be inserted into the support plate when the adhesive protrusions are separated from the substrate.

The adhesive chuck may further comprises a support jaw formed on an inner surface of the support plate into which the lift plate is inserted, a latch jaw formed on a peripheral surface of the lift plate inside the support jaw and supported by the support jaw in an overlapping state, and a lift driving member between the latch jaw and the support jaw.

The lift driving member may be a cam of which outer periphery can be rotated in a state of adjoining the latch jaw, the apparatus may further comprise an elastic member disposed at an interface between the adhesive chuck and the lift plate, and the lift plate may be moved up or down oblique to the inner surface of the support plate.

BRIEF DESCRIPTION OF THE DRAWINGS

The above and other objects, features and advantages of the present invention will become apparent from the following description of exemplary embodiments given in conjunction with the accompanying drawings, in which:

FIG. 13 is a flow chart of a method of assembling substrates using a substrate assembling apparatus according to an embodiment of the present invention.

DETAILED DESCRIPTION OF THE INVENTION

Figure 1:
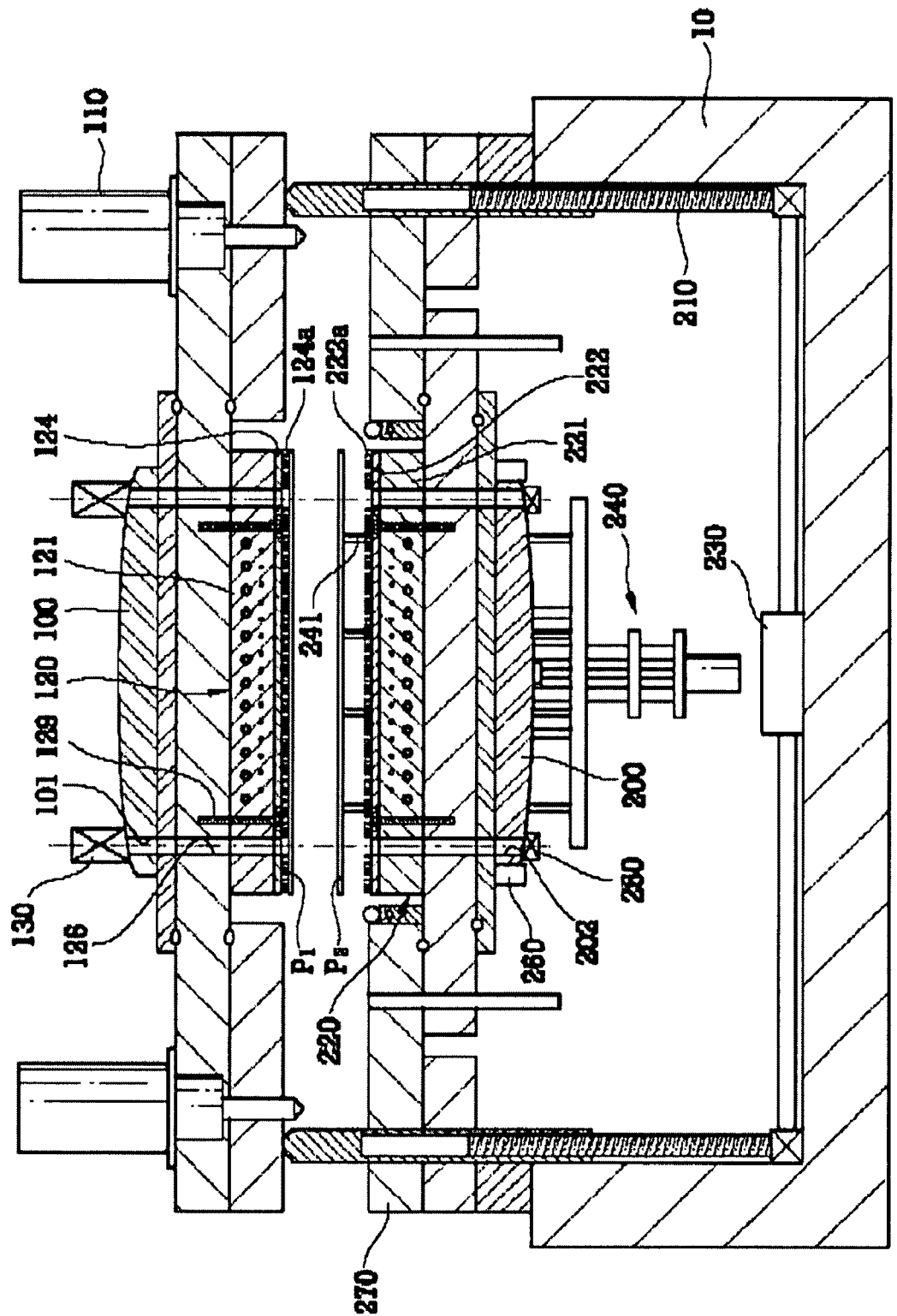
FIG. 1 is a schematic cross-sectional view of a substrate assembling apparatus according to an embodiment of the present invention.

Exemplary embodiments of the present invention are described in detail with reference to the accompanying drawings hereinafter. Terms used herein may be referred differently in the art. If there is functional similarity or equivalence between the embodiments and modification, it can be considered that the modification is equivalent to the present embodiments. For descriptive convenience, the components of the respective embodiments will be denoted by reference numerals. It is to be understood that the present invention is not limited to the components shown in the drawings and denoted by the reference numerals. Further, partial modification of a certain component shown in the drawings is equivalent to the component, if there is functional similarity or equivalence therebetween.

FIG. 1 is a schematic cross-sectional view of a substrate assembling apparatus according to an embodiment of the invention. Referring to FIG. 1, the apparatus comprises a base frame 10 constituting an appearance of the apparatus. The apparatus comprises a lower chamber 200 inside the frame 10 and an upper chamber 100 above the lower chamber 200. A processing room is defined between the upper and lower chambers 100 and 200, where first and second substrates P1 and P2 are assembled. As an exemplary embodiment of the invention, a vacuum assembling apparatus for assembling substrates in a closed space created by coupling the upper and lower chambers 100 and 200 will be described herein. However, assembling the substrate can be performed in the space defined by the lower and upper chambers 100 and 200 not only in a vacuum state but also at a typical ambient pressure.

The upper chamber 100 is supported by a lift screw 210 and a lift motor 230 provided to the lower chamber 200 to move up or down. The lift screw 210 and the lift motor 230 constitute a driving unit (not shown) for assembling the substrates P1 and P2.

The driving unit may be operated in conjunction with a linear actuator 110 described below, adsorption grooves 125 formed on adhesive chucks 120 and 220, and the like, when assembling the substrates P1 and P2. The driving unit may be embodied in various forms by employing a mechanical or pneumatic compression method, ultraviolet curing, etc.

A first adhesive chuck 120 is located at a lower center of the upper chamber 100. The surface of the first adhesive chuck 120 is formed with a plurality of first adhesive protrusions 124a at a high density to adhere the first substrate P1 to the first adhesive chuck 120 via Van der Waals force that is an intermolecular attractive force. The first chuck 120 comprises a first support plate 121 formed of an aluminum-based metal and a first adhesive plate 124 coupled to the first support plate 121 and having the first protrusions 124a thereon.

The first substrate P1 may be an array substrate or a color filter substrate. A plurality of cameras 130 are arranged on the upper chamber 100 for alignment of the substrates P1 and P2. To allow operation of the respective cameras 130, photographing holes 101 are formed through the upper chamber 100 to pass through the first substrate P1. A linear actuator 110 is equipped at a circumferential edge of the upper chamber 100. The linear actuator 100 serves to minutely adjust a gap between the upper and lower chambers 100 and 200 for adjustment of separation between the substrates P1 and P2 when assembling the substrates P1 and P2.

A second adhesive chuck 220 is located at an upper center of the lower chamber 200 and has a plurality of second adhesive protrusions 222a to adhere the second substrate P2 to the second chuck 220 via the intermolecular attractive force. The second chuck 220 comprises a second support plate 221 formed of an aluminum-based metal and a second adhesive plate 222 coupled to the second support plate 221 and having the second adhesive protrusions 222a formed thereon. The substrate P2 adhered to the second chuck 220 is different from the substrate P1 and may be the array substrate or the color filter substrate.

The second chuck 220 is provided with a lift driving unit 240 to move the substrate P2 up or down and with a plurality of lift pins 241 coupled to the lift driving unit 240 and passing through the lower chamber 200 and the second chuck 220.

Therefore, the second substrate P2 can be seated on the second chuck 220 by means of the lift pins 241 and the lift driving unit 240. Further, an illuminating device 250 is disposed under the lower chamber 200 for alignment of the substrates P1 and P2. The illuminating device 250 illuminates alignment marks of the substrates P1 and P2 when taking pictures of the alignment marks with the cameras 130. The lower chamber 200 has illuminating holes 202 passing through the lower chamber 200 to allow light from the illuminating device 250 to reach the cameras 130. The illuminating holes 202 are in communication with the photographing holes 101 to allow the cameras 130 to photograph the alignment marks of the first and second substrates P1 and P2.

Around the second chuck 220 of the lower chamber 200 are disposed a linear gauge 260 for measuring a distance between the upper and lower chambers 100 and 200, and an UVW table 270 for alignment.

The first and second adhesive chucks 120 and 220 have substantially the same construction. Hereinafter, the first adhesive chuck 120 will be described along with different features of the second adhesive chuck 220 without separate descriptions of the first and second chucks 120 and 220.

Figure 2:
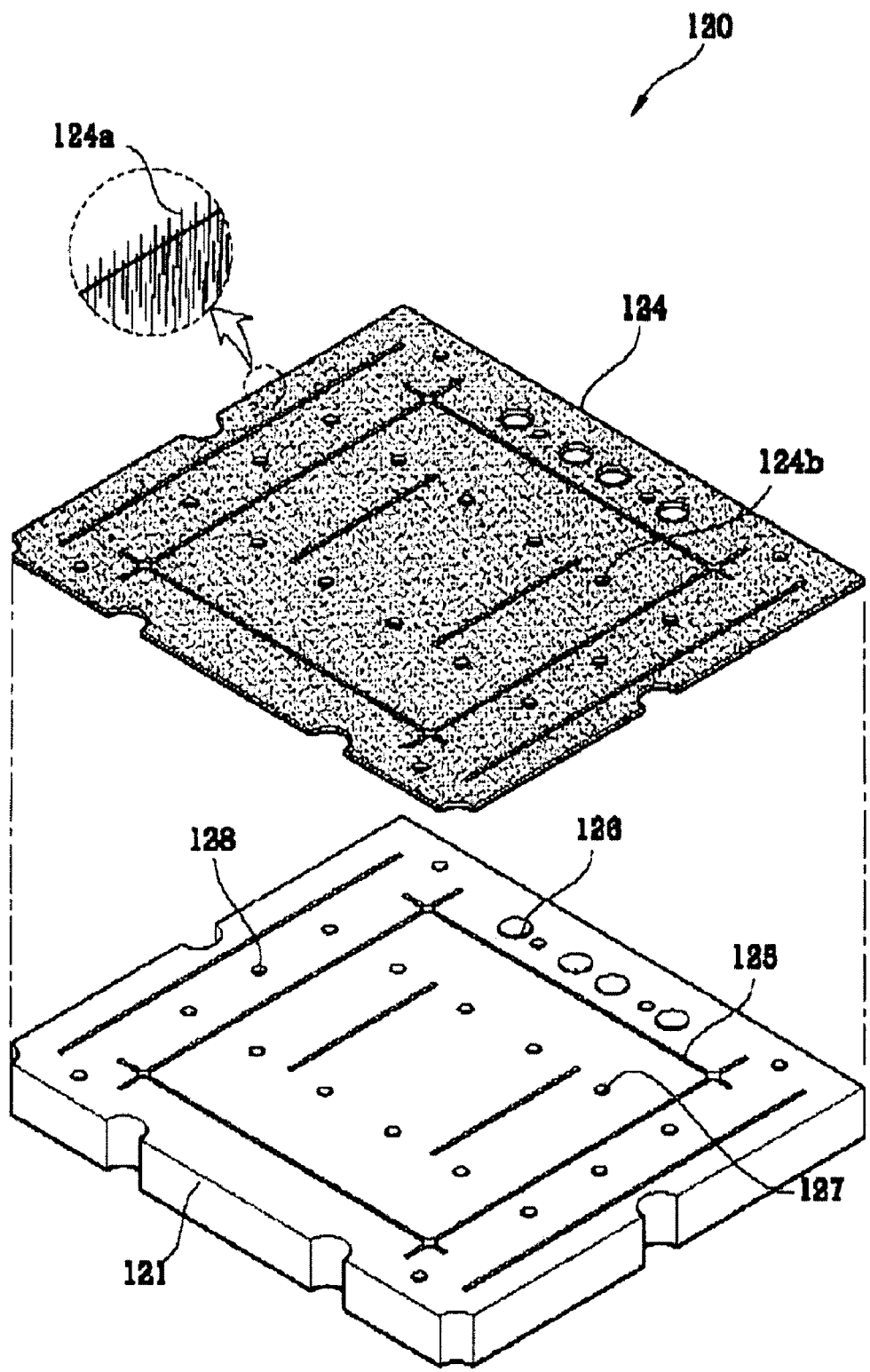
FIG. 2 is a perspective view of an adhesive chuck for the apparatus according to the embodiment of the present invention.

FIG. 2 is a perspective view of an adhesive chuck for the apparatus according to the embodiment of the invention. Referring to FIG. 2, the adhesive chuck 120 comprises a support plate 121 and an adhesive plate 124. The support plate 121 has a plurality of adsorption grooves 125 formed thereon. The adsorption grooves 125 serve to adsorb a substrate P1 when the substrate P1 is initially conveyed into the apparatus. When assembling the substrate P1, the adsorption grooves 125 serve to assist in assembling the substrates P1 and P2 by allowing a compression gas to be injected through the adsorption grooves 125.

Thus, the second chuck 120 may have a pressure passage (not shown) formed therein for adsorption and compression of the substrate P1 or the adsorption grooves 125 may pass vertically through the support plate 121 and be connected with an outside pressure pipe. Here, the second adhesive chuck 220 may be formed with pin holes (not shown) through which the lift pins 241 pass. Further, the adhesive chuck 120 is formed with chuck-side photographing holes 126 communicated with the photographing holes 101 of the upper chamber 100, and fastening holes 127 through which the adhesive chuck 120 is secured to the upper chamber 100 by means of fastening bolts 129 (see FIG. 1). The support plate 121 is formed with plane adjustment holes 128 for horizontal adjustment of the assembled chuck 120.

Meanwhile, the protrusions 124a integrally protruding from the adhesive plate 124 may have spherical distal ends or spatula-shaped distal ends. Such an adhesive plate 124 and adhesive protrusions 124a may be formed in a micro/nano-structure using a meltable wax and the like through molding.

Specifically, for manufacture of the adhesive plate 124 and adhesive protrusions 124a, first, nano-size grooves of a high aspect ratio on a cured wax plate are formed into a template by reactive ion etching and the like. Then, thermally or UV curable liquid molding materials such as fibers, resins or liquid carbon-based materials are supplied to the template to fill the respective grooves with the molding materials. Next, the molding material is cured by applying heat or UV light, and finally the template is removed. The template may be removed by a separate solvent or by etching and the like. As a result, the adhesive plate 124 and adhesive protrusions 124a are integrally formed by removing the template.

Alternatively, the adhesive plate 124 and adhesive protrusions 124a can be made using micro-electro-mechanical systems and semiconductor manufacturing processes such as an electron-beam exposing process, a thermal oxidation and etching process, a nano-laser process, etc. Further, the adhesive plate 124 can be made in mass production using the initially produced adhesive plate as a master plate.

Figure 3A:
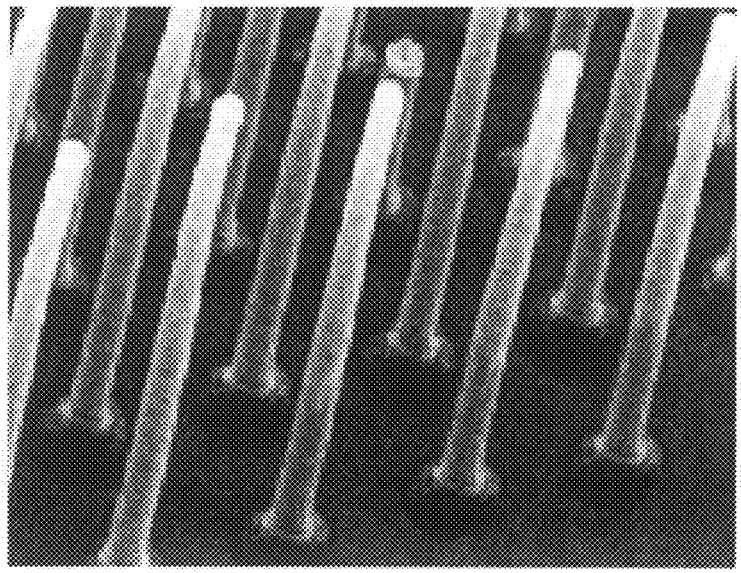
FIG. 3a is a micrograph of adhesive protrusions according to an embodiment of the present invention.
Figure 3B:
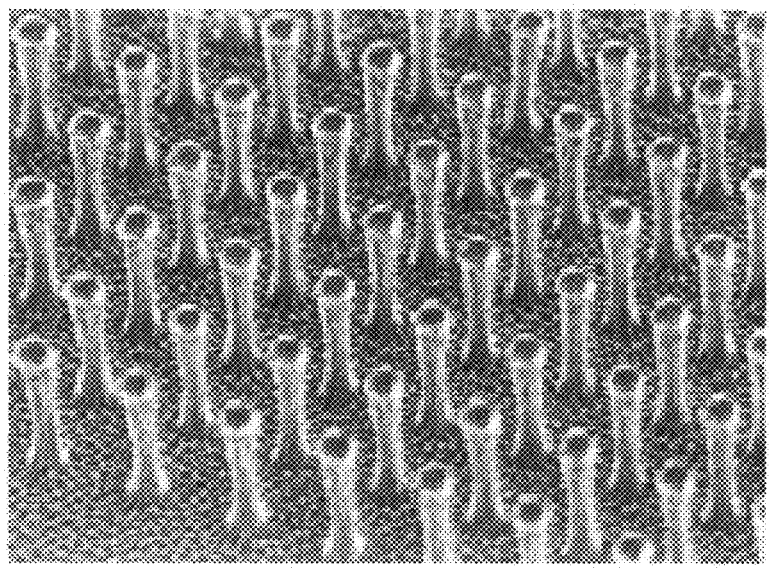
FIG. 3b is a micrograph of other adhesive protrusions according to an embodiment of the present invention.

FIG. 3a is a micrograph of one type of adhesive protrusions according to an embodiment of the invention, and FIG. 3b is a micrograph of another type of adhesive protrusions according to an embodiment of the invention.

On the adhesive plate 124, each of the protrusions 124a may have a length of about 0.5~20 μm and a diameter of 50~2,000 nm, and be separated a distance of several dozens ~ several thousands μm from others. Further, the respective protrusions 124a are inclined at an angle of 30 to 60 degrees.

As reported by Kellar Autumn et al. in "Adhesive force of a single gecko foot-hair," Nature, Vol. 405, Jun. 8, 2000, a single adhesive protrusion 124a exhibits an adhesive force of up to about 200 uN. Since several tens of thousands of protrusions 124a can be formed in 1 cm$^2$, it is possible for the adhesive chuck to exhibit 200 g.f/cm$^2$ or more, that is, about 1.9 N or more per cm$^2$. On the other hand, since a conventional electrostatic chuck is known as typically having an electrostatic adhesive force of about 2 g.f/cm$^2$, the adhesive chuck 124 of the embodiment can also make satisfactory adhesion, support and conveyance of a large substrate P1. Further, it is possible to adjust an adhesive force by lowering the density of the protrusions 124a.

Figure 4:
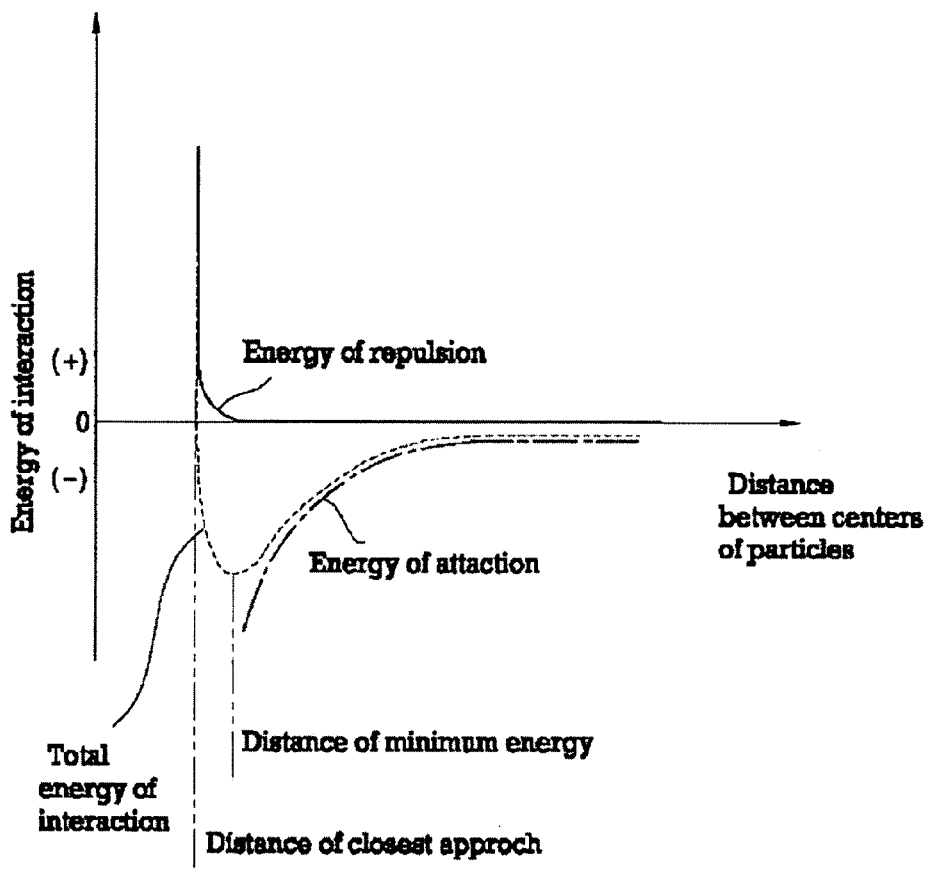
FIG. 4 is a graph representing adhering and separating states of the adhesive protrusions according to the embodiment of the present invention.

FIG. 4 is a graph representing adhering and separating states of the adhesive protrusions according to this embodiment. FIG. 4 shows how an intermolecular attractive force, van der Waals force, interacts for two molecular models. First, for the total energy of interaction, the intermolecular energy is generated as the highest energy of repulsion (+) at a distance of closest approach and rapidly decreases in energy of repulsion along with generation of energy of attraction as the intermolecular distance increases.

The energy of repulsion is generated according to repulsive interaction, that is, Pauli Exclusion Principle. Thus, an increase in intermolecular distance results in a rapid decrease in the energy of repulsion, which is a repulsive interaction between the molecules. And, the total energy of interaction shows that the energy of attraction (−), van der Waals force, is generated at a distance of minimum energy between the molecules where almost all the energy of repulsion is lost. As the distance between the molecules is further increased, the energy of attraction between the molecules is gently reduced. In other words, the graph shows generation of the energy of repulsion and the energy of attraction being van der Waals force depending on the distance between the centers of the molecules.

Thus, adhesion to the substrate P1 or P2 can be achieved when the substrate P1 or P2 is moved toward and brought into close contact with the adhesive plate 124 on which the adhesive protrusions 124a are formed. However, separation of the substrate P1 or P2 from the adhesive plate requires a separate process. More detailed construction of the adhesive chuck 120 will be descried hereinafter.

Figure 5:
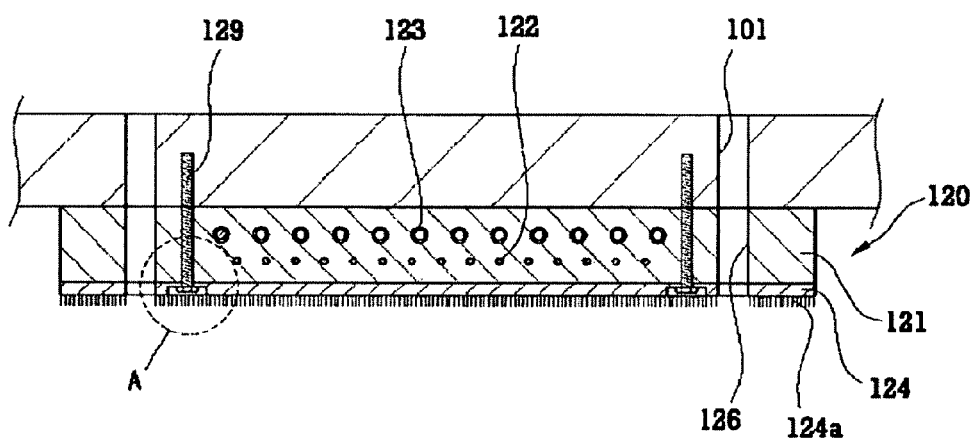
FIG. 5 is a cross-sectional view of the adhesive chuck according to the embodiment of the present invention.
Figure 6:
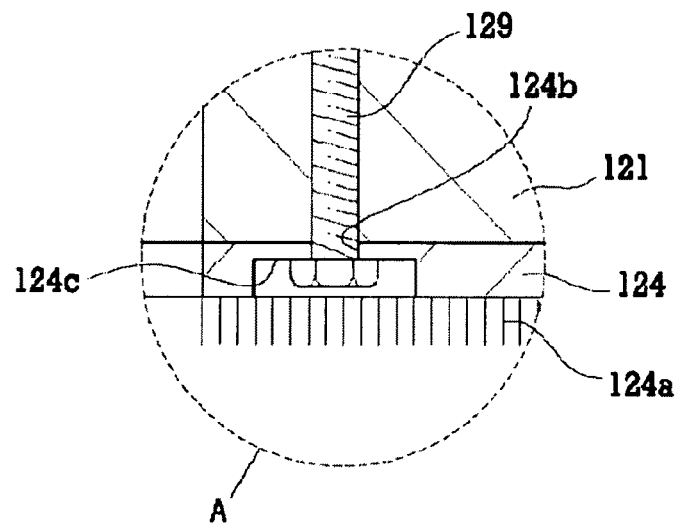
FIG. 6 is an enlarged perspective view of Part A of FIG. 5.

FIG. 5 is a cross-sectional view of the adhesive chuck according to an embodiment and FIG. 6 is an enlarged perspective view of Part A of FIG. 5.

Referring to FIGS. 5 and 6, the adhesive chuck 120 comprises the support plate 121 and the adhesive plate 124 attached to the support plate 121. The shape of the adhesive plate 124 substantially corresponds to that of the support plate 121. A stepped portion 124c is formed on each of holes 124b corresponding to the fastening holes 127 formed in the support plate 121 of the adhesive plate 124 and is compressed by a head of the fastening bolt 129 when the bolt 129 is fastened to the associated fastening hole, so that the adhesive plate 124 can be further firmly coupled to the support plate 121.

A separating member is provided in the support plate 121 to separate the substrate P1 (P2). In one embodiment of the invention, the separating member is a heating member 122. In the event of separating the substrate P1 (P2) from the protrusions 124a, the heating member 122 heats the support plate 121 to separate the protrusions 124a from the substrate P1 (P2). In other words, when heat is applied thereto, the adhesive plate 124 and protrusions 124a are expanded to change the energy of repulsion between the molecules, allowing separation of the substrate P1 (P2) from the protrusions 124a. For this purpose, the heating member 122 may be a heating wire, a heat pipe with refrigerant, or a thermoelectric device.

On the other hand, when the substrate P1 (P2) is separated, it is desirable that the temperature of the chuck 120 rapidly return back to an original state. In the case where the chuck remains at an elevated temperature, the chuck 120 can be reduced in effect of adhering to the substrate at a subsequent process. Of course, self-cooling can be expected though exposure of the substrate P1 (P2) to air. In this case, however, since a processing period can increase, forced cooling can be advantageously adopted to achieve rapid cooling of the chuck 120.

For the forced cooling, a cooling member 123 may be provided inside the support plate 121. The cooling member 123 may be a cooling pipe buried therein, through which a cooling gas such as helium is supplied to the substrate, a heat pipe configured to allow refrigerant to flow therethrough, or a thermoelectric device.

For the heat pipe, it is possible to use separate heating and cooling pipes or to adopt a circulation construction with a four-way valve. For the thermoelectric device, power may be alternately supplied to an associated thermoelectric device to heat or cool the plate 124. Generally, helium gas is used for cooling in a display manufacturing process and a semiconductor manufacturing process. Therefore, in the embodiment of FIG. 5, the heating wire and the cooling pipe are shown.

Although it is possible to employ a heating manner for separation of the substrate P1 (P2), separation of the substrate can be achieved by rapid cooling. Because, in the event of making adhesion via Van der Waals force, retraction of the adhesive protrusions 124a causes a rapid increase in the energy of repulsion which is the repulsive force between the molecules, as shown in FIG. 4, and with which the separation can be performed.

Alternatively, separation of the substrate P1 (P2) can be achieved by means of a mechanical operation. Hereinafter, there will be a description of adhesive chucks according to other embodiments of the present invention, which employ the mechanical operation for separation of the substrate P1 (P2). In the following description, components of these embodiments will be denoted by different reference numerals.

Figure 7:
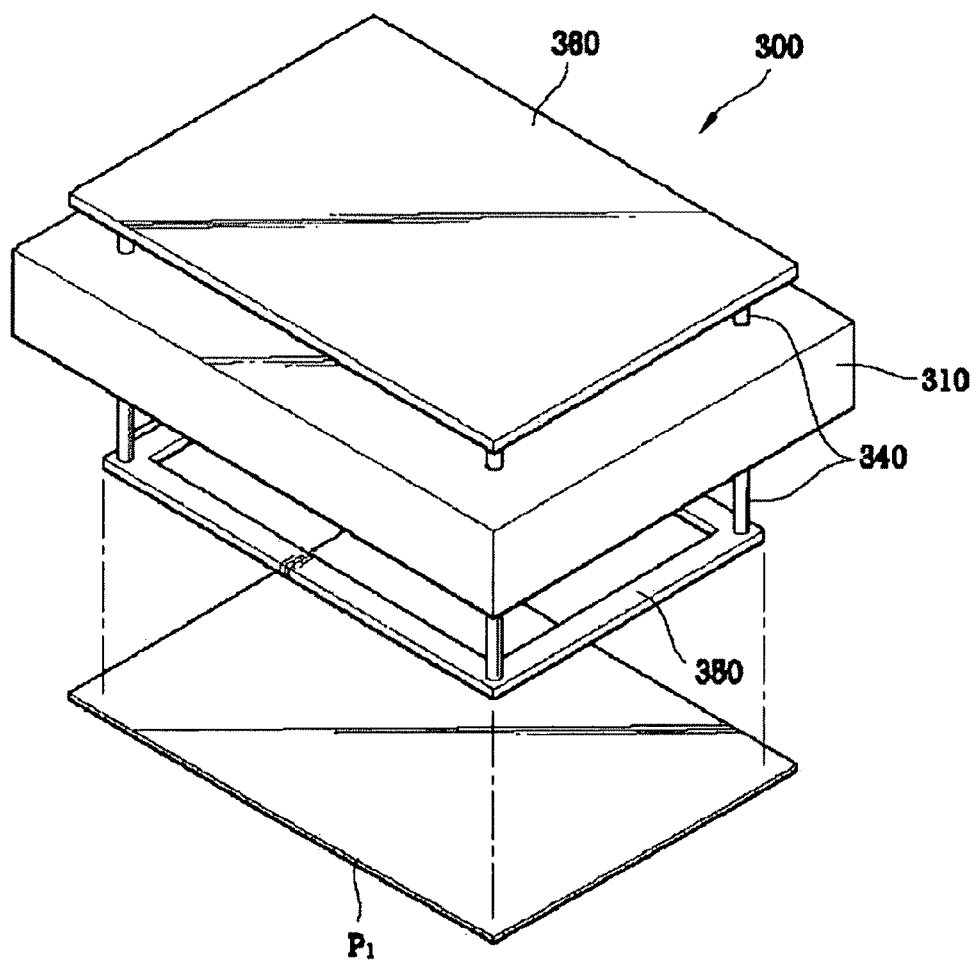
FIG. 7 is a perspective view of an adhesive chuck according to another embodiment of the present invention.
Figure 8:
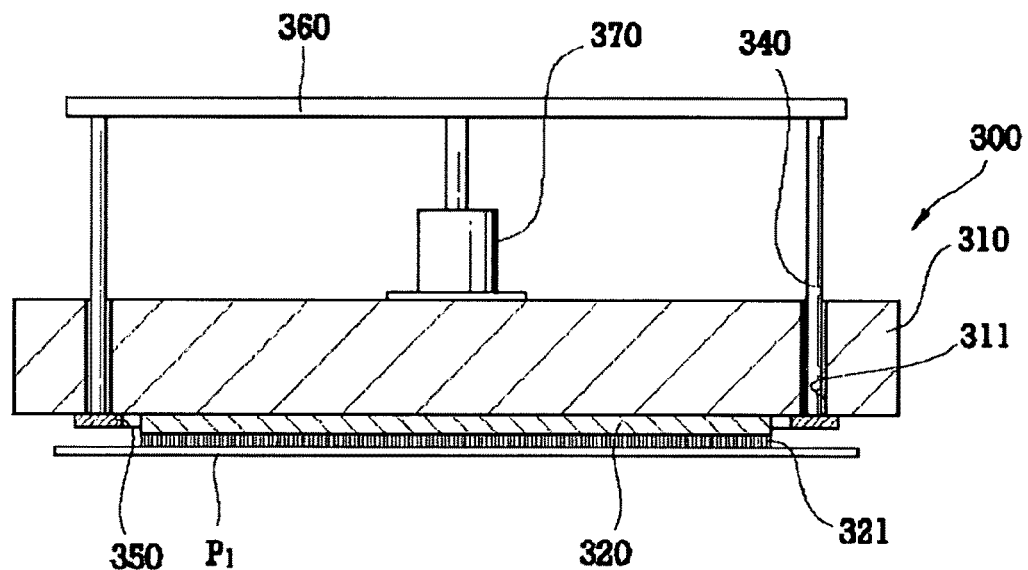
FIG. 8 is a cross-sectional view of the adhesive chuck of FIG. 7, to which a substrate is adhered.
Figure 9:
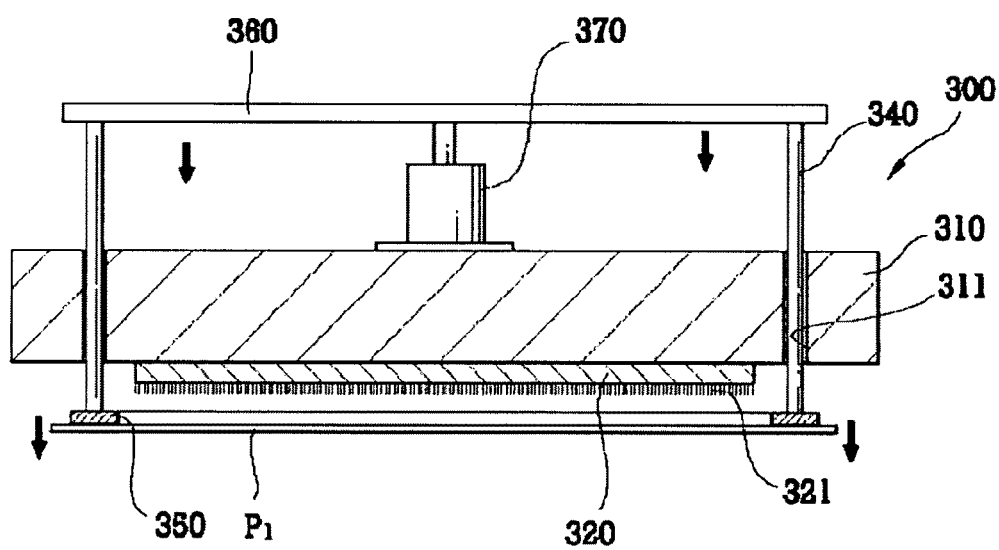
FIG. 9 is a cross-sectional view showing an operation of separating the substrate from the adhesive chuck of FIG. 7.

FIG. 7 is a perspective view of an adhesive chuck according to another embodiment of the invention, FIG. 8 is a cross-sectional view of the adhesive chuck of FIG. 7, to which a substrate is adhered, and FIG. 9 is a cross-sectional view showing an operation of separating the substrate from the adhesive chuck of FIG. 7.

Referring to FIGS. 7 and 8, an adhesive chuck 300 comprises a support plate 310. The support plate 310 is provided with an adhesive plate 320 that has adhesive protrusions 321 on a lower surface (an upper surface in the case of an upward adhesion) thereof. The support plate 310 may be provided with a separation member. The separation member comprises separating pins 340 passing through four through-holes 311 respectively formed at four corners of the support plate 310, and a separating bar 350 coupled to lower ends of the separating pins 340 and located along an edge of a lower surface of the support plate 310. The separating bar 350 is thinner than the adhesive plate 320.

The separating pins 340 pass through the support plate 310 and are connected with a power unit positioned above the support plate 310. The power unit comprises a compressing plate 360 coupled to the respective separating pins 340 to apply power to the separating pins at the same time, and an actuator 370 to operate the compressing plate 360.

With such structure, the adhesive chuck 320 of this embodiment adheres the substrate P1 (P2) to the adhesive plate 320 when the substrate P1 (P2) is seated thereon. When separating the substrate P1 (P2) from the adhesive plate 320, the actuator 370 lowers the compressing plate 360, as shown in FIG. 6. The compressing plate 360 lowers the separating pins 340 and separating bar 350. This generates a uniform separating force associated with the separating bar 350 around the substrate P1 (P2). That is, the compressing plate 360 applies the separating force to the substrate P1 (P2) in a state of being dispersed as evenly as possible, thereby separating the substrate P1 (P2) from the chuck.

Further, when using a large substrate, pieces of the separating bar are connected diagonally to allow more uniform separating force to be applied to the overall substrate, thereby enabling easier separation of the substrate from the chuck.

Figure 10:
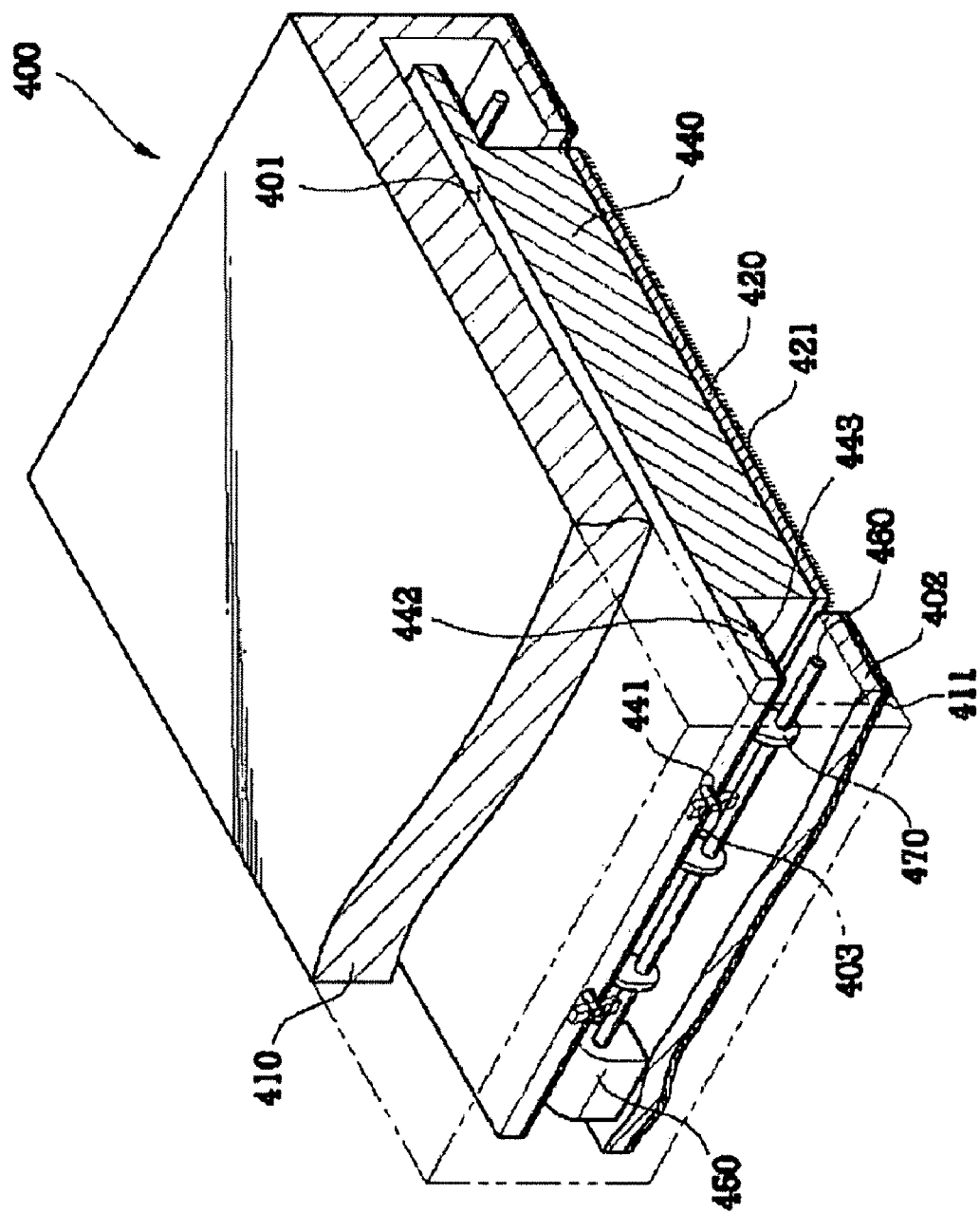
FIG. 10 is a partially cut-away perspective view of an adhesive chuck according to yet another embodiment of the present invention.
Figure 11:
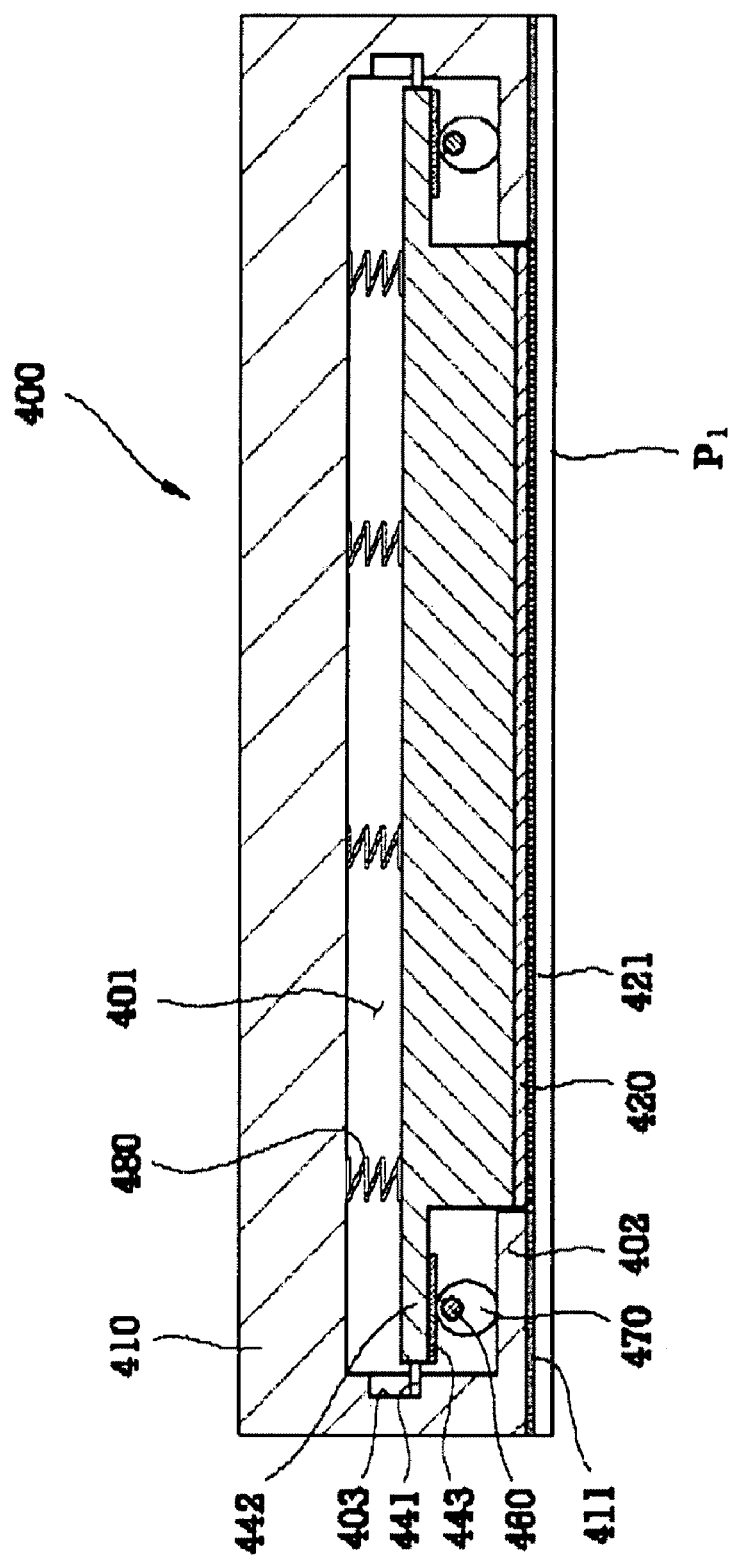
FIG. 11 is a side sectional view of the adhesive chuck of FIG. 10.
Figure 12A:
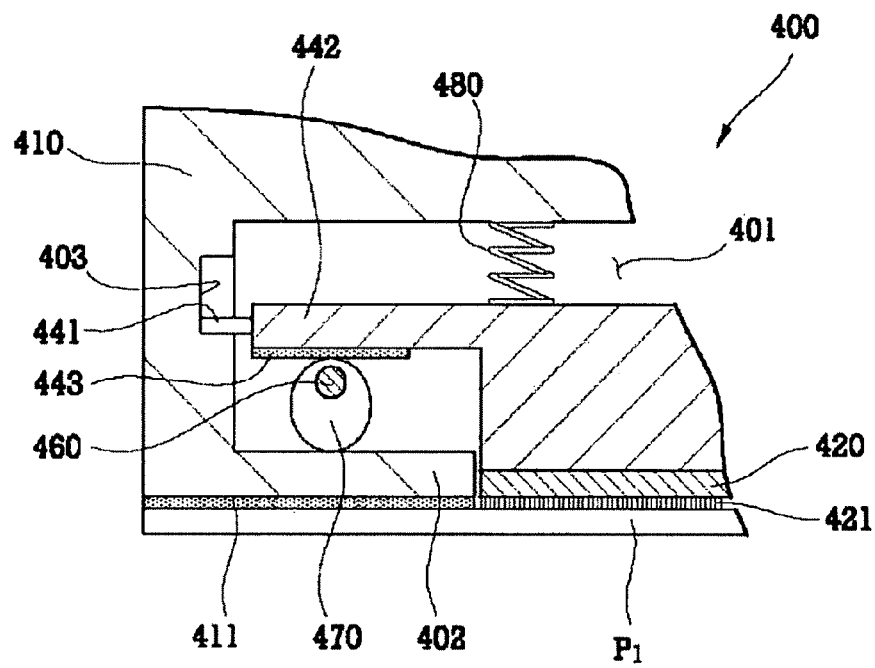
FIGS. 12a and 12b are enlarged cross-sectional views of main parts of the adhesive chuck of FIG. 10, illustrating operation of the chuck.
Figure 12B:
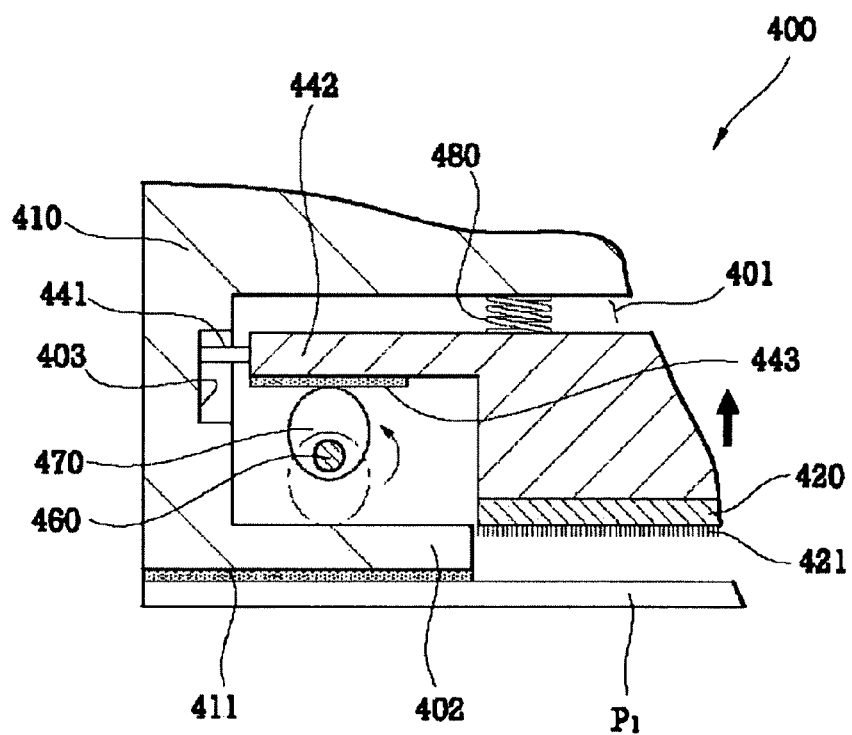

FIG. 10 is a partially cut-away perspective view of an adhesive chuck according to yet another embodiment of the invention, FIG. 11 is a side sectional view of the adhesive chuck of FIG. 10, and FIGS. 12a and 12b are enlarged cross-sectional views of main parts of the adhesive chuck of FIG. 10, illustrating operation of the chuck.

Referring to FIGS. 10 and 11, an adhesive chuck 400 comprises a support plate 410. The support plate 410 has an installation part 401 formed at a lower side (an upper side in the case of an upward adhesion) by machining the lower surface of the support plate 410 to be sunk. The installation part 401 is provided with a lift plate 440 that can move up or down within the installation part 401.

The chuck 400 further comprises an adhesive plate 420 that is attached to a lower surface of the lift plate 440 and has a plurality of adhesive protrusions 421. The protrusions 421 are exposed from the lower side of the support plate 410 when holding the substrate P1 (P2) and are inserted into the lower side of the support plate 410 when the lift plate 440 is lifted into the installation part 401. Additionally, the lift plate 440 has guide protrusions 441 formed on opposite sides of the lift plate 440. The installation part 401 is formed at an inner side with guide grooves 403 corresponding to the guide protrusions 441. The guide grooves 403 may be formed obliquely. When the guide grooves 403 are formed obliquely, it is possible to separate the substrate P1 (P2) from the adhesive protrusions 421 with less force. In other words, since the adhesive protrusions 421 are formed of material such as fibers, they can exhibit an elastic force. Therefore, since the adhesive protrusions 421 are bent by application of force to the adhesive protrusions 421 in a lateral direction, separation of the substrate P1 (P2) from the adhesive protrusions 421 can be performed with less force than in forced separation upward and downward.

The lift plate 440 comprises a latch jaw 442 formed at an upper portion of either side thereof. The installation part 401 is provided at a lower portion of either inner side of the installation part 401 with a support jaw 402 corresponding to the latch jaw 442. The support jaw 402 is provided at a lower side with a friction material 411 to be brought into contact with the substrate P1 (P2). The friction material 411 prevents the substrate P1 (P2) from sliding to a right or left side without damage to the substrate P1 (P2). In other words, the friction material prevents damage of an alignment state of the substrate P1 (P2).

The latch jaw 442 and the support jaw 402 are disposed to overlap each other. Additionally, a lift driving member is provided on the support jaw 402. The lift driving member comprises a motor 450, a rotational shaft 460 rotated by the motor 450, and a plurality of cams 470 installed to be rotated by the rotational shaft 460. The outer periphery of each cam 470 is bought into close contact with a lower portion of the latch jaw 442, and, a lubricating pad 443 is provided to an interface between the cam 470 and the latch jaw 442. The lift driving member may be implemented by a solenoid or a piezoelectric device.

An elastic member 480 is interposed between an inner upper surface of the installation part 401 and an upper surface of the lift plate 440. The elastic member 480 may be a spring, an elastic rubber, and other things that exhibit an elastic force.

With such structure as described above, in the adhesive chuck 400 of this embodiment, a longer radius section of the cam 470 is located at a lower side, while a shorter radius section of the cam 470 is located at an upper side, as shown in FIG. 12a, when a substrate is adhered to the chuck 400. Thus, the adhesive protrusions 421 formed on the lower side of the lift plate 440 are exposed from the lower surface of the support plate 410. In this state, the substrate P1 (P2) is conveyed and adhered to the protrusions 421 via an intermolecular attractive force.

On the other hand, when separating the substrate from the protrusions, the motor 450 is rotated to rotate the cam 370, as shown in FIG. 12b. Then, the longer radius section of the cam 470 is located at the upper side, while the shorter radius section of the cam 470 is located at the lower side, allowing the adhesive protrusions 421 to be inserted into the support plate 410. At this time, the substrate P1 (P2) has a wider area than the lift plate 440 and is brought at an edge of the substrate into close contact with a lower end of the support plate 410. As a result, when the adhesive protrusions 421 are raised with the edge of the substrate P1 (P2) brought into close contact with the friction material 411 of the support plate 410, the substrate P1 (P2) is separated from the protrusions 421.

The lift plate 440 may be raised obliquely. Since the respective protrusions 421 become bent as the lift plate 440 is raised obliquely, separation of the substrate P1 (P2) from the protrusions 421 can be performed with less force. In this case, separating force to be applied to the substrate P1 (P2) can be further reduced. Further, in the case where the adhesive protrusions 421 are formed obliquely, the separation of the substrate P1 (P2) from the protrusions 421 can be performed more effectively when lift plate 440 is raised obliquely.

A method of assembling substrates using the assembling apparatus and the adhesive chuck constructed as described above according to an embodiment of the invention will be described. The embodiment of the method can be understood with reference to the substrate assembling apparatus according to the embodiment shown in FIGS. 1 and 2.

FIG. 13 is a flow chart of a method of assembling substrates using a substrate assembling apparatus according to an embodiment of the present invention.

Referring to FIG. 13, a first substrate P1 is conveyed into a processing room defined between the upper and lower chambers 100 and 200 at S100. Conveyance of the first substrate P1 can be performed by means of a robot arm that holds the substrate via vacuum adhesion. The first substrate P1 is adhered to the first adhesive protrusions 124a formed on the first adhesive plate 124 of the first adhesive chuck 120 at S200. Adhesion of the first substrate P1 to the first chuck 120 can be performed by making the first adhesive plate 124 and the first substrate P1 move close to and contact each other by raising the robot arm or lowering the first support plate 121.

Then, a second substrate P2 is conveyed into the upper and lower chambers 100 and 200 by means of the robot arm at S300.

When the second substrate P2 is located at a predetermined location in the apparatus, the lift pins 241 are raised to support the second substrate P2. Then, the robot arm is moved outside the chambers 100 and 200. Next, when the lift pins 241 are lowered, the second substrate P2 is seated on the second adhesive chuck 200. As a result, the second substrate P2 is adhered to the second adhesive protrusions 222a of the second adhesive plate 222.

When the respective substrates P1 and P2 are adsorbed by the adsorption grooves 125 formed on the respective adhesive chucks 120 and 220 for more efficient adhesion, the substrates P1 and P2 can be more efficiently adhered to the adhesive protrusions 124a and 222a. Thus, the adhesion of the substrates P1 and P2 is performed at ambient pressure.

Then, the upper chamber 100 is lowered. Lowering of the upper chamber 100 also lowers the first adhesive chuck 120. Accordingly, the first substrate P1 and second substrate P2 are moved toward each other and aligned to face each other at a preset distance therebetween at S400. Here, a distance between the substrates is measured by a sensor. The cameras 130 are operated to photograph alignment marks on the first and substrates P1 and P2 to monitor alignment between the first substrate P1 and the second substrate P2, and the UVW table 270 is operated to adjust alignment between the first and second substrates P1 and P2 through a UVV driving unit (not shown). Alignment of the substrates including a pre-alignment, a final alignment, etc. are repeated several times depending on the distance between the first and second substrates P1 and P2 until the substrates P1 and P2 are completely assembled.

When the upper chamber 100 continues to be lowered and is brought into close contact with the lower chamber 200, a processing room defined by the upper and lower chambers 100 and 200 is sealed from outside environment. Then, when pre-alignment between the first and second substrates P1 and P2 is accomplished, the processing room between the upper and lower chambers 100 and 200 is forcibly evacuated to a vacuum state. Such a vacuum state can be obtained by means of a dry pump and a turbo molecular pump (TMP).

When a predetermined vacuum degree is obtained, the first adhesive chuck 120 is further lowered until the first substrate P1 approaches the second substrate P2 and is spaced a minimum preset distance from the second substrate P2. At this time, the cameras 130 are operated to take pictures of the alignment marks of the first and second substrates P1 and P2 to accomplish final alignment.

After the final alignment, the first substrate P1 adhered to the first adhesive chuck 120 is separated from the first chuck 120. Here, separation of the first substrate is performed by thermal separation, forced mechanical separation, etc., as described above.

Therefore, when the first substrate P1 is separated from the first chuck 120, the first substrate is dropped toward the second substrate P2 and makes close contact therewith by means of a sealant coated between the first and second substrates P1 and P2. After the substrate P1 is dropped, nitrogen gas of a high pressure is injected through the adsorption grooves 125 of the first adhesive chuck 120 to compress the first substrate P1. Accordingly, the interior of the first and second chambers 100 and 200 is changed from the vacuum state to an ambient pressure state.

In other words, a sealed gap between the first and second substrates P1 and P2 is in a vacuum state, whereas the processing room inside the first and second chambers 100 and 200 is in an atmospheric state, so that assembling of the first and second substrates P1 and P2 can be accomplished by a pressure difference between the interior and outside of the substrates P1 and P2, and compressing force of the gas at S500. Additionally, injection of liquid crystals having been applied along with the sealant is carried out simultaneously with assembling the substrates. Alternatively, injection of the liquid crystals can be independently carried out after assembling the substrates. Then, inspection of an assembled state between the substrates P1 and P2 or additional curing of the sealant through illumination of UV light can be performed.

When the substrates are completely assembled, the upper chamber 100 is raised by means of the lift screw 210 and lift motor 230 to open the chambers 100 and 200. When the chambers 100 and 200 are opened, the lift pins 241 are lifted to raise the assembled substrates P1 and P2. At this time, separation of the second substrate P2 from the second adhesive chuck 220 is performed simultaneously or previously.

Specifically, when raising the lift pins 241 after weakening an intermolecular bonding force between the second substrate P2 and the second chuck 220 by heating the second chuck 220, the second substrate P2 can be naturally separated from the second chuck 220. Then, when the assembled substrates P1 and P2 are located at a discharge location by further raising the lift pins 241, the robot arm is moved to a lower side of the assembled substrate from outside of the chambers 100 and 200, and carries the assembled substrates outside the apparatus at S600. Then, other substrates located outside the chambers 100 and 200 are assembled by repeating the process as described above.

The adhesive chuck, apparatus and method for assembling substrates using the same according to these embodiments as described above can be embodied in different fashions by modifying part of the components or the method by those skilled in the art.

In modified embodiments, the adhesive chuck of the invention can be applied to a semiconductor manufacturing process, substrate assembling apparatuses designed for substrate assembling at ambient pressure, other apparatuses for a display manufacturing process, robot arms for conveying substrates, etc.

Furthermore, the substrate assembling apparatus may comprise two substrate-adhering devices, one of which is an electrostatic chuck and the other of which being the adhesive chuck according to the embodiment of the invention. Alternatively, the substrate assembling apparatus may comprise a single electrostatic chuck, some parts of which generate an electrostatic force, and the other parts of which being formed with adhesive protrusions, thereby enabling adhesion of a substrate to the electrostatic chuck via the electrostatic force and intermolecular attractive force.

In this case, a process of assembling the substrates can be performed in such a fashion as to adjust adhesion of the substrate via the electrostatic force and adhesion of the substrate using the adhesive protrusions. In addition, the adhesive chuck of the invention can be applied to other types of substrate assembling apparatus, which are different from the embodiments of the substrate assembling apparatus described above. Therefore, if a certain modification comprises main components of the adhesive chuck or the apparatus of the invention, it can be understood that the modification is not departed from the scope of the present invention.

As apparent from the above description, the adhesive chuck, apparatus and method for assembling substrates using the same according to the present invention can achieve adhesion and separation of a substrate with minimal power consumption, enhancing an operating efficiency. Additionally, the chuck of the invention can overcome a problem of spot generation on a display panel caused by remaining static electricity which occurs when using an electrostatic chuck. Furthermore, since the chuck of the invention is almost free from a problem of electric instability, it can exhibit high stability and efficiency, and can be fabricated at lower costs compared with conventional electrostatic chucks.

Although the present invention has been described with reference to the embodiments and the accompanying drawings, it is not limited to the embodiments and the drawings. It should be understood that various modifications and changes can be made by those skilled in the art without departing from the spirit and scope of the present invention defined by the accompanying claims.

What is claimed is:

1. A substrate assembling apparatus, comprising:
   a chamber;
   a first adhesive chuck located inside the chamber comprising a support plate having a cavity formed on a surface thereof and a separating member to separate a first substrate from a plurality of adhesive protrusions, the separating member comprising:
      a lift plate movably positioned inside the cavity and having the plurality of adhesive protrusions to adhere to a first substrate conveyed from an outside into the chamber via an intermolecular attractive force, wherein the plurality of adhesive protrusions are positioned on a surface of the lift plate; and
      a cam rotatably positioned inside the cavity to move the lift plate into the cavity such that the surface of the lift plate and the plurality of adhesive protrusions are moved inside the cavity beyond the surface of the support plate to separate the plurality of adhesive protrusions from the first substrate; and
   a driving unit to move the first substrate adhered to the first adhesive chuck and a second substrate disposed within the chamber toward each other to be compressed and assembled to each other.

2. The apparatus according to claim 1, further comprising:
   a second adhesive chuck having a plurality of adhesive protrusions to adhere to the second substrate via the intermolecular attractive force.

3. The apparatus according to claim 2, wherein the first or second adhesive chuck comprises an adhesive plate coupled at one side to the lift plate and formed at the other side with the adhesive protrusions.

4. The apparatus according to claim 1, wherein the separating member comprises a heating member which heats the adhesive protrusion so as to weaken the intermolecular attractive force when the first substrate is separated from the lift plate.

5. The apparatus according to claim 4, wherein the first or second adhesive chuck comprises a cooling member to cool the adhesive protrusions.

6. The apparatus according to claim 1, wherein the first or second adhesive chuck comprises a latch jaw formed at either side of the lift plate, a support jaw formed corresponding to the lift plate inside the adhesive chuck to support the latch jaw, and the cam interposed between the latch jaw and the support jaw to move the lift plate.

7. The apparatus according to claim 6, further comprising:
   an elastic member disposed at an interface between the first or second adhesive chuck and the lift plate.

8. The apparatus according to claim 6, wherein the lift plate is moved obliquely up or down.

9. A substrate assembling apparatus, comprising:
   a chamber;
   a first adhesive chuck located inside the chamber comprising a support plate having a cavity formed on a surface thereof and a separating member to separate a first substrate from a plurality of adhesive protrusions, the separating member comprising:
      a lift plate movably positioned inside the cavity and having the plurality of adhesive protrusions to adhere to a first substrate conveyed from an outside into the chamber via an intermolecular attractive force, wherein the plurality of adhesive protrusions are positioned on a surface of the lift plate; and
      a cam rotatably positioned inside the cavity to move the lift plate into the cavity such that the surface of the lift plate and the plurality of adhesive protrusions are moved inside the cavity beyond the surface of the support plate to separate the plurality of adhesive protrusions from the first substrate; and
   a driving unit to move the first substrate adhered to the first adhesive chuck and a second substrate disposed within the chamber toward each other to be compressed and assembled to each other,
   wherein the first or second adhesive chuck comprises a latch jaw formed at either side of the lift plate, a support jaw formed corresponding to the lift plate inside the adhesive chuck to support the latch jaw, and the cam interposed between the latch jaw and the support jaw to move the lift plate, and
   wherein the cam rotates such that an outer periphery of the cam rotates while being adjoined to the latch jaw.

10. The apparatus according to claim 9, wherein the cam is configured to rotate such that a first distance from an axis of rotation of the cam to a first location on the outer periphery of the cam is greater than a second distance from the axis of rotation of the cam to a second location on the outer periphery of the cam.

11. The apparatus according to claim 10, wherein the cam is oblong.

12. An adhesive chuck, comprising:
   a support plate having a cavity formed on a surface thereof and a separating member, the separating member comprising:
      a lift plate movably positioned inside the cavity;
      an adhesive plate positioned on a surface of the lift plate and having a plurality of adhesive protrusions to adhere to a conveyed substrate via an intermolecular attractive force, wherein the plurality of adhesive protrusions are positioned on a surface of the adhesive plate; and
      a cam rotatably positioned inside the cavity to move the lift plate into the cavity such that the surface of the lift plate and the plurality of adhesive protrusions are moved inside the cavity beyond the surface of the support plate,
   wherein the separating member comprises a heating member which heats the adhesive protrusion so as to weaken the intermolecular attractive force when the first substrate is separated from the lift plate.

13. The adhesive chuck according to claim 12, wherein the support plate comprises a cooling member to cool the adhesive protrusions.

14. The adhesive chuck according to claim 12, further comprising:
   a support jaw formed on an inner surface of the support plate into which the lift plate is inserted;
   a latch jaw formed on a peripheral surface of the lift plate inside the support jaw and supported by the support jaw in an overlap state; and
   a lift driving member between the latch jaw and the support jaw.

15. The adhesive chuck according to claim 14, wherein the cam rotates such that an outer periphery of the cam can be rotated in a state of adjoining the latch jaw.

16. The apparatus according to claim 15, wherein the cam is configured to rotate such that a first distance from an axis of rotation of the cam to a first location on the outer periphery of the cam is greater than a second distance from the axis of rotation of the cam to a second location on the outer periphery of the cam.

17. The apparatus according to claim 16, wherein the cam is oblong.

18. The adhesive chuck according to claim 12, further comprising:

an elastic member disposed at an interface between the adhesive chuck and the lift plate.

19. The adhesive chuck according to claim 12, wherein the lift plate is moved up or down oblique to an inner surface of the support plate.

* * * * *